(12) United States Patent
Li

(10) Patent No.: US 11,211,135 B2
(45) Date of Patent: Dec. 28, 2021

(54) FUSE STORAGE CELL, STORAGE ARRAY, AND OPERATION METHOD OF STORAGE ARRAY

(71) Applicants: Semiconductor Manufacturing International (Shanghai) Corporation, Shanghai (CN); Semiconductor Manufacturing International (Beijing) Corporation, Beijing (CN)

(72) Inventor: Xiaohua Li, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 0 days.

(21) Appl. No.: 17/060,501

(22) Filed: Oct. 1, 2020

(65) Prior Publication Data

US 2021/0210153 A1 Jul. 8, 2021

(30) Foreign Application Priority Data

Jan. 8, 2020 (CN) .......................... 202010018907.6

(51) Int. Cl.
*G11C 17/16* (2006.01)
*G11C 17/18* (2006.01)

(52) U.S. Cl.
CPC ............ *G11C 17/165* (2013.01); *G11C 17/18* (2013.01)

(58) Field of Classification Search
CPC .............................. G11C 17/165; G11C 17/16
USPC ........................................................... 365/96
See application file for complete search history.

(56) References Cited

U.S. PATENT DOCUMENTS

| | | | |
|---|---|---|---|
| 6,184,720 B1* | 2/2001 | Kim ................. | G01R 31/31712 327/37 |
| 9,978,435 B1* | 5/2018 | Park .................... | G11C 11/4074 |
| 2005/0029621 A1* | 2/2005 | Kamiya .............. | H01L 23/5256 257/529 |
| 2008/0212388 A1* | 9/2008 | Hoefler ................. | G11C 17/18 365/225.7 |
| 2013/0258748 A1* | 10/2013 | Kim ........................ | G11C 7/14 365/96 |

* cited by examiner

*Primary Examiner* — Muna A Techane
(74) *Attorney, Agent, or Firm* — Anova Law Group, PLLC

(57) ABSTRACT

The present disclosure provides a fuse storage cell. The fuse storage cell includes a transistor and N fuse elements. The transistor includes a source, a drain, and a gate. Each fuse element of the N fuse elements includes a first terminal and a second terminal. The first terminal of the fuse element is electrically connected to the drain of the transistor, and the second terminal of the fuse is configured for inputting a read voltage or a programming voltage. N is a positive integer.

20 Claims, 5 Drawing Sheets

Providing a fuse storage array, the fuse storage array including M storage cells, counting from a first storage cell to an $M^{th}$ storage cell, where M is a positive integer — S11

Performing a read operation on a $j^{th}$ fuse element of the $i^{th}$ storage cell of the fuse storage array, where i is a positive integer smaller than or equal to M, j is a positive integer smaller than or equal to N, and the read operation including: applying a read voltage on the second terminal of the fuse element; applying a turn-on voltage on the word line; and reading a current signal on the source of the transistor — S12

Performing a programming operation on the $j^{th}$ fuse element of the $i^{th}$ storage cell of the fuse storage array, the programming operation including: applying a first programming voltage on the second terminal of the fuse element; and applying a second programming voltage on the word line — S13

FIG. 4

FUSE STORAGE CELL, STORAGE ARRAY, AND OPERATION METHOD OF STORAGE ARRAY

CROSS-REFERENCE TO RELATED APPLICATIONS

This application claims the priority of Chinese Patent Application No. CN202010018907.6, filed on Jan. 8, 2020, the entire content of which is incorporated herein by reference.

FIELD OF THE DISCLOSURE

The present disclosure generally relates to the field of semiconductor manufacturing and, more particularly, relates to a fuse storage cell, and a fuse storage array and an operation method thereof.

BACKGROUND

In the field of semiconductor manufacturing, the electrically-programmable fuse (eFuse) technology demonstrates various advantages, such as desired compatibility with complementary metal-oxide-semiconductor (CMOS) logic devices, ease of use, etc. Therefore, the eFuse technology has been be widely used as one-time programmable (OTP) memory in many circuits.

According to the theory of electromigration, in the eFuse technology, information stored in a device is determined by whether the electric fuse is blown by a current. The electric fuse has a small resistance before it is blown, and the resistance can be regarded as infinite after being blown by a continuous high current. The blown state of the fuse will be permanently maintained. The eFuse technology has been widely used in redundant circuits to reduce chip failure, improve chip ID, device basic code, etc., and replace one-time small-capacity programmable memory.

However, the size of existing electrically programmable fuse memory is large, and the performance may still need to be improved. The disclosed fuse storage cell, fuse storage array, and operation method of the fuse storage array are directed to solve one or more problems set forth above and other problems in the art.

BRIEF SUMMARY OF THE DISCLOSURE

One aspect of the present disclosure provides a fuse storage cell. The fuse storage cell includes a transistor, including a source, a drain, and a gate; and N fuse elements. Each fuse element of the N fuse elements includes a first terminal and a second terminal. The first terminal of the fuse element is electrically connected to the drain of the transistor, and the second terminal of the fuse is configured for inputting a read voltage or a programming voltage. N is a positive integer.

Optionally, the fuse storage cell further includes a word line electrically connected to the gate of the transistor.

Optionally, the source of the transistor is connected to a ground.

Optionally, the second terminals of the N fuse elements configured for inputting read voltages or programming voltages are independent from each other.

Optionally, each fuse element of the N fuse elements includes at least one of a metal fuse element or a polycrystalline-silicon fuse element.

Another aspect of the present disclosure provides a fuse storage array. The fuse storage array includes M storage cells, where M is a positive integer. Each storage cell of the M storage cells includes a transistor, including a source, a drain, and a gate, and N fuse elements. Each fuse element of the N fuse elements includes a first terminal and a second terminal. The first terminal of the fuse element is electrically connected to the drain of the transistor, and the second terminal of the fuse element is configured for inputting a read voltage or a programming voltage. N is a positive integer.

Optionally, the fuse storage array further includes a plurality of word lines. Each word line of the plurality of word lines is electrically connected to the gate of a transistor in the fuse storage array.

Optionally, the source of each transistor in the fuse storage array is connected to a ground.

Optionally, the N fuse elements included in each storage cell includes a first fuse element, a second fuse element, ..., and an $N^{th}$ fuse element; and in the M storage cells of the fuse storage array, second terminals of a number M of $j^{th}$ fuse elements are used for simultaneously applying read voltages or programming voltages, where j is a positive integer smaller than or equal to N.

Optionally, in each storage cell of the M storage cells, second terminals of the N fuse elements configured for inputting read voltages or programming voltages are independent from each other.

Optionally, in each storage cell of the M storage cells, each fuse element of the N fuse elements includes at least one of a metal fuse element or a polycrystalline-silicon fuse element.

Another aspect of the present disclosure provides an operation method of a fuse storage array. The operation method includes providing the fuse storage array, including M storage cells, where M is a positive integer. Each storage cell of the M storage cells includes a transistor, including a source, a drain, and a gate, and N fuse elements. Each fuse element of the N fuse elements includes a first terminal and a second terminal. The first terminal of the fuse element is electrically connected to the drain of the transistor, and the second terminal of the fuse element is configured for inputting a read voltage or a programming voltage. N is a positive integer. The operation method also includes performing a read operation on a $j^{th}$ fuse element of an $i^{th}$ storage cell of the fuse storage array, where i is a positive integer smaller than or equal to M, and j is a positive integer smaller than or equal to N. The read operation includes applying a read voltage on the second terminal of the $j^{th}$ fuse element of the $i^{th}$ storage cell, applying a turn-on voltage on a word line connected to the gate of the transistor of the $i^{th}$ storage cell, and reading a current signal on the source of the transistor of the $i^{th}$ storage cell. The operation method further includes performing a programming operation on the $j^{th}$ fuse element of the $i^{th}$ storage cell of the fuse storage array. The programming operation includes applying a first programming voltage on the second terminal of the $j^{th}$ fuse element of the $i^{th}$ storage cell, and applying a second programming voltage on the word line connected to the gate of the transistor of the $i^{th}$ storage cell.

Optionally, the first programming voltage is higher than the read voltage; and the second programming voltage is higher than the turn-on voltage.

Optionally, the read state of the storage cells includes "0" or "1".

Optionally, when the read state is "0", the read current signal is greater than 600 μA; and when the read state is "1", the read current signal is less than 15 μA.

Optionally, an operation time of the programming operation is less than 10 μs.

Optionally, the source of each transistor in the fuse storage array is connected to a ground.

Optionally, the N fuse elements included in each storage cell includes a first fuse element, a second fuse element, . . . , and an $N^{th}$ fuse element; and in the M storage cells of the fuse storage array, second terminals of a number M of $j^{th}$ fuse elements are used for simultaneously applying read voltages or programming voltages, where j is a positive integer smaller than or equal to N.

Optionally, in each storage cell of the M storage cells, second terminals of the N fuse elements configured for inputting read voltages or programming voltages are independent from each other.

Optionally, in each storage cell of the M storage cells, each fuse element of the N fuse elements includes at least one of a metal fuse element or a polycrystalline-silicon fuse element.

Compared to existing fuse storage cell, storage array, and operation method, the disclosed fuse storage cell, storage array, and operation method demonstrate the following exemplary advantages.

According to the disclosed fuse storage cell, the fuse storage cell includes a transistor and a total of N fuse elements, such that a single transistor can be used to drive each fuse element in stages, thereby improving the utilization rate of the fuse storage cell.

According to the disclosed fuse storage array, a fuse storage cell includes a transistor and multiple fuse elements such that the total number of fuse storage cells is reduced. As such, the storage circuit is simple, and the size of the circuit layout is reduced. Therefore, the area of the fuse storage array on the chip may be saved, which further improves the utilization of the chip area.

Further, each storage cell of the fuse storage array includes a total of N fuse elements, and a second terminal of a $j^{th}$ fuse element of the plurality of storage cells is configured for simultaneously applying a read voltage or a programming voltage, where j is a positive integer smaller than or equal to N. As such, when applying a read voltage or programming voltage to the second terminal of the $j^{th}$ fuse element of any storage cell, because the total number of storage cells is reduced, the current path to the $j^{th}$ fuse element becomes shorter, so that the loss of the read voltage or programming voltage may be reduced. Therefore, the power consumption of the circuit of the fuse storage array may be reduced, and the performance of the circuit may be improved.

According to the disclosed fuse storage array and operation method, the operation method of the fuse storage array is simple, and the operation efficiency is high. As such, multiple accesses of the fuse storage array may be realized, and the utilization rate of the fuse storage array may be improved.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIG. 4 illustrates a flowchart of an exemplary operation method of a fuse storage array according to various embodiments of the present disclosure.

DETAILED DESCRIPTION

Reference will now be made in detail to exemplary embodiments of the present disclosure, which are illustrated in the accompanying drawings. Wherever possible, the same reference numbers will be used throughout the drawings to refer to the same or like parts.

Figure 1:
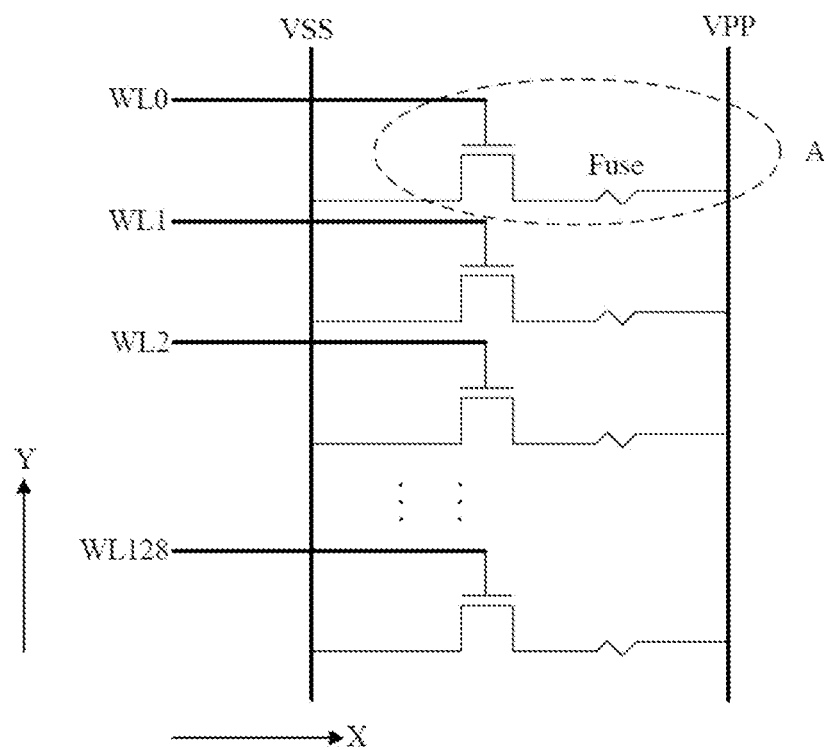
FIG. 1 illustrates a schematic circuit diagram of a fuse storage cell and a storage array.

FIG. 1 illustrates a schematic circuit diagram of a fuse storage cell and a storage array. Referring to FIG. 1, a fuse storage array includes a plurality of fuse storage cells A arranged along a second direction Y. Each fuse storage cell A includes a transistor (not labeled) and a fuse element connected in series with the transistor. The transistor includes a source, a drain, and a gate, and the fuse element includes a first terminal and a second terminal with the first terminal connected to the drain of the transistor and the second terminal configured for inputting a voltage VPP. The fuse storage array also includes a word line (e.g., WL0, WL1, . . . , or WL128) connected to the gate of the transistor. The source of the transistor of each fuse storage cell A is connected to the ground VSS.

In each fuse storage cell A, the fuse element is a metal fuse element, such that a relatively large fusing current is required to blow the fuse to realize the programming function of the fuse storage cell. Therefore, a relatively large voltage needs to be applied to the second terminal of the fuse element, and a large voltage needs to be applied to the word line to obtain a large fusing current. Because the fuse storage cell includes a transistor and a fuse element, the size of the transistor needs to be made larger to allow a large fusing current passing through. Therefore, the area occupied by the transistor accounts for more than 70% of the area of the fuse storage cell.

In a complex circuit, a plurality of fuse elements is required to form a fuse storage array to realize multiple one-time programming functions. Therefore, a plurality of fuse storage cells are needed. The plurality of fuse storage cells includes a plurality of fuse transistors and a plurality of fuse elements, and thus the circuit of the fuse storage array is complicated and the circuit layout area of the fuse storage array is also large. As the size of the semiconductor structure becomes smaller and smaller, the circuit layout area of the fuse storage array becomes larger, so that the utilization rate of the chip area is smaller, which may be adverse to advanced semiconductor manufacturing.

The present disclosure provides a fuse storage cell, a fuse storage array, and an operation method of the fuse storage array. In the fuse storage array, a fuse storage cell includes a transistor and a plurality of fuse elements, so that the total number of the fuse storage cells is reduced. As such, the storage circuit is simple, and the size of the circuit layout may be reduced. Therefore, the area of the fuse storage array on the chip may be saved, which further improves the utilization of the chip area.

To make the aforementioned objectives, features, and beneficial effects of the present disclosure more comprehensible, specific embodiments of the present disclosure are described in detail with reference to the accompanying drawings.

Figure 2:
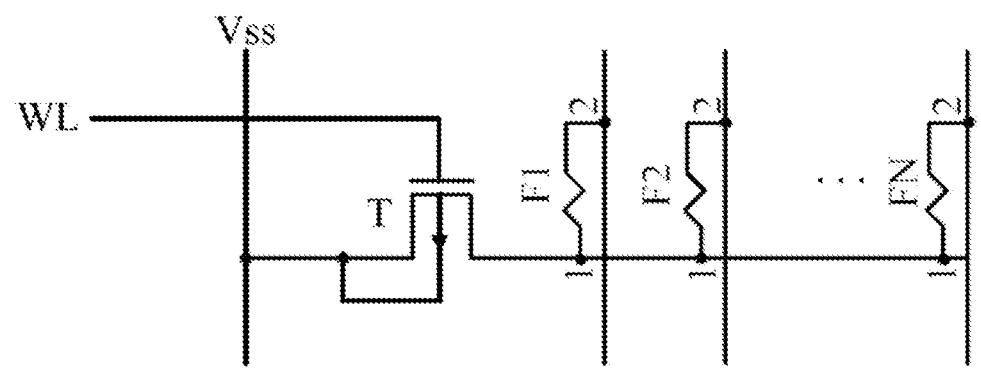
FIG. 2 illustrates a schematic circuit diagram of an exemplary fuse storage cell according to various embodiments of the present disclosure.

FIG. 2 illustrates a schematic circuit diagram of an exemplary fuse storage cell according to various embodiments of the present disclosure. Referring to FIG. 2, the fuse storage cell may include a transistor T and multiple fuse elements. The total number of the multiple fuse elements may be N, where N is a positive integer (e.g., an integer greater than or equal to 1). Each fuse element may include a first terminal and a second terminal with the first terminal of the fuse element connected to the drain of the transistor T and the second terminal configured for inputting a read voltage or a programming voltage.

In one embodiment, the multiple fuse elements included in the fuse storage cell may include a first fuse element F1, a second fuse element F2, . . . , and a $N^{th}$ fuse element FN. The first fuse element F1 may include a first terminal A1 and a second terminal B1, the second fuse element F2 may include a first terminal A2 and a second terminal B2, . . . , and the $N^{th}$ fuse element FN may include a first terminal AN and a second terminal BN.

In the fuse storage cell, a first transistor T may be connected to a total of N fuse elements, such that a single transistor T may be used to drive each fuse element in stages, thereby improving the utilization rate of the fuse storage cell. In one embodiment, the transistor T may be used to turn on or turn off the fuse storage circuit.

The transistor T may be an N-type metal-oxide-semiconductor (NMOS) transistor or a P-type metal-oxide-semiconductor (PMOS) transistor. In one embodiment, the transistor T may be an NMOS transistor.

The carriers in the NMOS transistor may be electrons and the carriers in the PMOS transistor may be holes. The mobility of electrons is larger than holes, such that the NMOS transistor may have a lower on-resistance as compared to the PMOS transistor. Therefore, the NMOS transistor may have a larger operating current. Because when writing into the fuse storage cell, a large current is required, the NMOS transistor may be a desired option to be applied to the circuit of the fuse storage cell.

The fuse element may be able to store information and the information stored in the fuse element may be determined by whether the fuse is blown by a current. The fuse element may have a small resistance before it is blown, and the resistance can be regarded as infinite after being blown by a continuous high current. Further, the blown state of the fuse element may be permanently maintained, such that one-time programming may be realized.

The fuse element may be a polycrystalline-silicon fuse element or a metal fuse element. In one embodiment, the fuse element may be a metal fuse element. The metal fuse element may include a tungsten-doped silicide fuse element, a cobalt silicide fuse element, or a nickel silicide fuse element. For example, the fuse element may be made of a nickel silicide fuse element.

In one embodiment, the first terminal of each fuse element may be a cathode, and the cathode of the fuse element may be connected to the drain of the transistor T. The second terminal of the fuse element may be an anode, and the anode of the fuse element may be configured for inputting a read voltage or a programming voltage.

In one embodiment, the second terminals of the multiple fuse elements configured for inputting read voltages or programming voltages may be independent from each other.

By setting the second terminals of the multiple fuse elements that configured for inputting read voltages or programming voltages independent from each other, a single resistor T can be used to drive each fuse element in stages. As such, the utilization rate of the fuse storage cells may be improved.

In one embodiment, the fuse storage cell may further include a word line WL connected to the gate of the transistor T. The word line WL may be the single line for controlling the read operation or the programming operation of the transistor T to implement the read operation or the programming operation of the fuse storage cell.

The word line WL may be a metal word line, and the metal word line may be a word line made of tungsten, aluminum, cobalt, titanium, titanium nitride, tantalum, tantalum nitride, ruthenium, copper, and a combination thereof.

In one embodiment, the fuse storage cell may further include a ground Vss, and the ground Vss may be electrically connected to the source of the transistor T. the source of the transistor T may be used to, when the fuse storage cell is performing a read operation, read the electrical signal of the fuse storage cell to determine the "0" or "1" state of the fuse storage cell.

Figure 3:
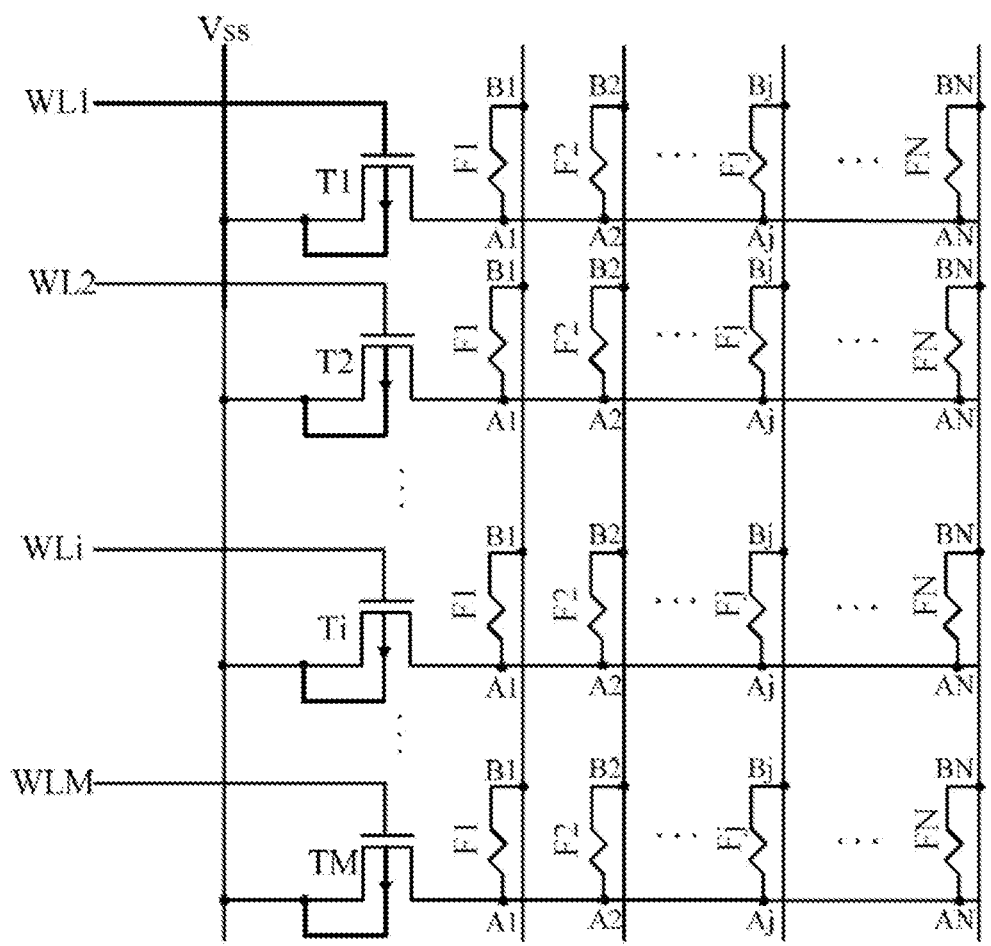
FIG. 3 illustrates a schematic circuit diagram of an exemplary fuse storage array according to various embodiments of the present disclosure.

FIG. 3 illustrates a schematic circuit diagram of an exemplary fuse storage array according to various embodiments of the present disclosure. Referring to FIG. 3, the fuse storage array may include a plurality of storage cells. The total number of the plurality of storage cells may be M, where M is a positive integer (e.g., an integer greater than or equal to 1). Each storage cell may include a transistor and multiple fuse elements. The total number of the multiple fuse elements included in each storage cell may be N, where N is a positive integer (e.g., an integer greater than or equal to 1). Each fuse element may include a first terminal and a second terminal with the first terminal of the fuse element connected to the drain of the transistor T and the second terminal configured for inputting a read voltage or a programming voltage.

In one embodiment, the transistors in the plurality of storage cells may include a first transistor T1, a second transistor T2, . . . , an $i^{th}$ transistor T1, . . . , or an $M^{th}$ transistor TM, where M is a positive integer (e.g. an integer greater than or equal to 1), and i is a positive integer smaller than or equal to M.

In one embodiment, the N fuse elements may include a first fuse element F1, a second fuse element F2, . . . , a $j^{th}$ fuse element Fj, . . . , and an $N^{th}$ fuse element FN, where j is a positive integer smaller than or equal to N.

In one embodiment, the first fuse element F1 may include a first terminal A1 and a second terminal B1, the second fuse element F2 may include a first terminal A2 and a second terminal B2, . . . , the $j^{th}$ fuse element Fj may include a first terminal Aj and a second terminal Bj, . . . , and the $N^{th}$ fuse element FN may include a first terminal AN and a second terminal BN.

In the fuse storage array, a fuse storage cell may include a transistor and multiple fuse elements such that the total number of fuse storage cells may be reduced. As such, the storage circuit is simple, and the size of the circuit layout may be reduced. Therefore, the area of the fuse storage array on the chip may be saved, which further improves the utilization of the chip area.

In one embodiment, each storage cell of the fuse storage array may include a first fuse element F1, a second fuse element F2, ..., a $j^{th}$ fuse element Fj, ..., and an $N^{th}$ fuse element FN. Moreover, in the M storage cells of the fuse storage array, the second terminals of a number M of $j^{th}$ fuse elements Fj may be configured for simultaneously applying read voltages or programming voltages. As such, when applying a read voltage or programming voltage to a second terminal Bj of the $j^{th}$ fuse element Fj of any storage cell, because the total number of storage cells is reduced, the current path to the $j^{th}$ fuse element Fj may become shorter, so that the loss of the read voltage or programming voltage may be reduced. Therefore, the power consumption of the circuit of the fuse storage array may be reduced, and the performance of the circuit may be improved.

In one embodiment, the fuse storage array may also include a plurality of word lines, and each word line may be electrically connected to the gate of a transistor included in the fuse storage array.

In one embodiment, the plurality of word lines may include a first word line WL1, a second word line WL2, ..., an $i^{th}$ word line WLi, ..., and an $M^{th}$ word line WLM. The first word line WL1 may be electrically connected to the gate of the first transistor T1, the second word line WL2 may be electrically connected to the gate of the second transistor T2, ..., the $i^{th}$ word line WLi may be electrically connected to the gate of the $i^{th}$ transistor Ti, ..., and the $M^{th}$ word line WLM may be electrically connected to the gate of the $M^{th}$ transistor TM.

In one embodiment, the fuse storage array may further include a ground Vss, and the ground Vss may be electrically connected to each transistor included in the fuse storage array.

The fuse storage array may respectively perform a read operation and a programming operation on any fuse element in each fuse storage cell. FIG. 4 illustrates a flowchart of an exemplary operation method of a fuse storage array according to various embodiments of the present disclosure.

Referring to FIG. 4, the operation method may include:

S11, providing a fuse storage array, the fuse storage array including a total of M storage cells, counting from a first storage cell to an $M^{th}$ storage cell, where M is a positive integer (e.g., an integer greater than or equal to 1);

S12, performing a read operation on a $j^{th}$ fuse element of the $i^{th}$ storage cell of the fuse storage array, where i is a positive integer smaller than or equal to M, j is a positive integer smaller than or equal to N, and the read operation including: applying a read voltage on the second terminal of the fuse element; applying a turn-on voltage on the word line; and reading a current signal on the source of the transistor;

S13, performing a programming operation on the $j^{th}$ fuse element of the $i^{th}$ storage cell of the fuse storage array, the programming operation including: applying a first programming voltage on the second terminal of the fuse element; and applying a second programming voltage on the word line.

In the following, detailed description will be provided with reference to the accompany drawings.

Referring to FIG. 3 a fuse storage array may be provided. The fuse storage array may include a total of M storage cells. The M storage cells may include a first storage cell, a second storage cell, ..., and an $M^{th}$ storage cell, where M is a positive integer.

Each storage cell may include a transistor, and a total of N fuse elements, where N is a positive integer (e.g., an integer greater than or equal to 1). Each fuse element may include a first terminal and a second terminal with the first terminal of the fuse element electrically connected to the drain of the transistor and the second terminal configured for inputting a read voltage or a programming voltage.

In one embodiment, the transistor in the plurality of storage cells may include a first transistor T1, a second transistor T2, ..., an $i^{th}$ transistor Ti, ..., or an $M^{th}$ transistor TM, where M is a positive integer (e.g. an integer greater than or equal to 1), and i is a positive integer smaller than or equal to M.

In one embodiment, the N fuse elements may include a first fuse element F1, a second fuse element F2, ..., a $j^{th}$ fuse element Fj, ..., and an $N^{th}$ fuse element FN, where j is a positive integer smaller than or equal to N.

In one embodiment, the first fuse element F1 may include a first terminal A1 and a second terminal B1, the second fuse element F2 may include a first terminal A2 and a second terminal B2, ..., the $i^{th}$ fuse element Fj may include a first terminal Aj and a second terminal Bj, ..., and the $N^{th}$ fuse element FN may include a first terminal AN and a second terminal BN.

In the fuse storage array, a fuse storage cell may include a transistor and multiple fuse elements such that the total number of fuse storage cells may be reduced. As such, the storage circuit is simple, and the size of the circuit layout may be reduced. Therefore, the area of the fuse storage array on the chip may be saved, which further improves the utilization of the chip area.

In one embodiment, each storage cell of the fuse storage array may include a first fuse element F1, a second fuse element F2, ..., a $j^{th}$ fuse element Fj, ..., and an $N^{th}$ fuse element FN. Moreover, in the M storage cells of the fuse storage array, the second terminals of a number M of $i^{th}$ fuse elements Fj may be configured for simultaneously applying read voltages or programming voltages, where j is a positive integer smaller than or equal to N.

In one embodiment, the fuse storage array may also include a plurality of word lines, and each word line may be electrically connected to the gate of a transistor included in the fuse storage array.

In one embodiment, the plurality of word lines may include a first word line WL1, a second word line WL2, ..., an $i^{th}$ word line WLi, ..., and an $M^{th}$ word line WLM. The first word line WL1 may be electrically connected to the gate of the first transistor T1, the second word line WL2 may be electrically connected to the gate of the second transistor T2, ..., the $i^{th}$ word line WLi may be electrically connected to the gate of the $i^{th}$ transistor Ti, ..., and the $M^{th}$ word line WLM may be electrically connected to the gate of the $M^{th}$ transistor TM.

Figure 5:
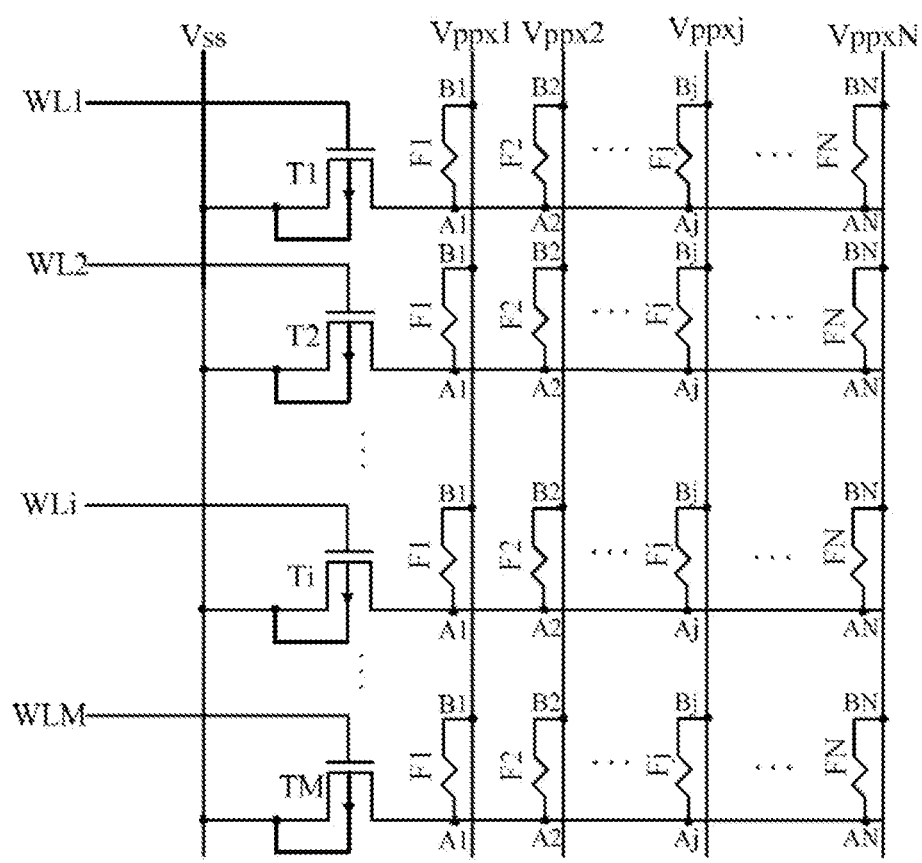
FIGS. 5-6 illustrate schematic circuit diagrams at certain stages of an operating process of an exemplary fuse storage array according to various embodiments of the present disclosure.
Figure 6:
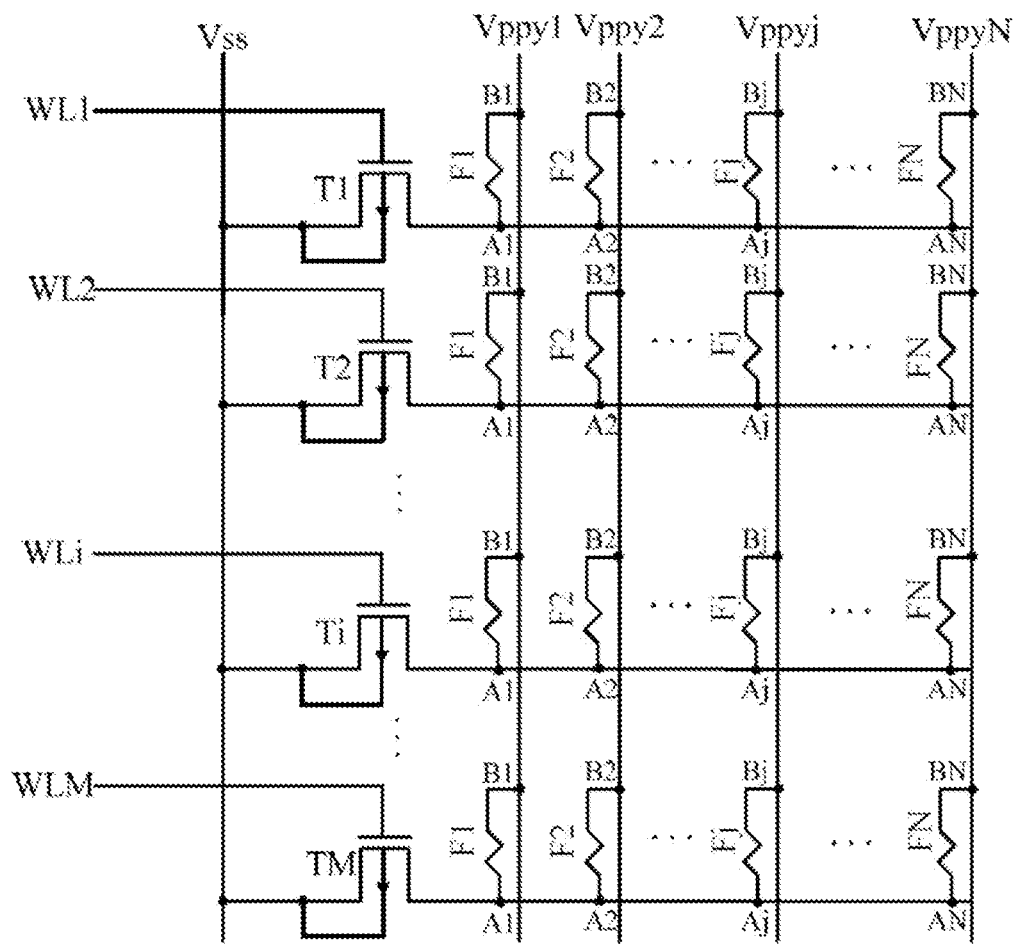

In one embodiment, the fuse storage array may further include a ground Vss, and each transistor included in the fuse storage array may be electrically connected to the ground Vss. FIGS. 5-6 illustrate schematic circuit diagrams at certain stages of an operating process of an exemplary fuse storage array according to various embodiments of the present disclosure.

Referring to FIG. 5, a read operation may be performed on a $j^{th}$ fuse element of an $i^{th}$ storage cell of the fuse storage array, where i is a positive integer smaller than or equal to M. The read operation may include applying a read voltage Vppxj to the second terminal Bj of the $j^{th}$ fuse element Fj; applying a turn-on voltage on the $i^{th}$ word line WLi; and reading the current signal on the source of the transistor Ti.

When performing the read operation, the read voltage may be small, and the turn-on voltage may be small. Therefore, it may be possible to read a current signal at the source of the transistor Ti, and determine whether the read state of the fuse storage cell is "0" or "1" according to the magnitude of the current signal.

When the current signal read from the source of the transistor Ti is large, the fuse element Fj of the $j^{th}$ fuse element may be in a non-blown state, the resistance of the $j^{th}$ fuse element Fj may be small, and the state of the fuse storage cell may be "0", that is, the fuse storage cell may have not been programmed or have not being successfully programmed.

In one embodiment, when the read state is "0", the current signal read from the source of the transistor Ti may be higher than 600 μA.

When the current signal read from the source of the transistor Ti is small, the fuse element Fj of the $j^{th}$ fuse element may be in a blown state, the resistance of the $j^{th}$ fuse element Fj may be large, and the state of the fuse storage cell may be "1", that is, the fuse storage cell may have been successfully programmed.

In one embodiment, when the read state is "1", the current signal read from the source of the transistor Ti may be smaller than 15 μA. Each storage cell of the fuse storage array may include a first fuse element F1, a second fuse element F2, . . . , a $j^{th}$ fuse element Fj, . . . , and an $N^{th}$ fuse element FN. Moreover, in the M storage cells of the fuse storage array, the second terminals of a number M of $j^{th}$ fuse elements Fj may be configured for simultaneously applying read voltages or programming voltages. As such, when applying a read voltage or programming voltage to a second terminal Bj of the $j^{th}$ fuse element Fj of any storage cell, because the total number of storage cells is reduced, the current path to the $j^{th}$ fuse element Fj may become shorter, so that the loss of the read voltage or programming voltage may be reduced. Therefore, the power consumption of the circuit of the fuse storage array may be reduced, and the performance of the circuit may be improved.

Referring to FIG. 6, a programming operation may be performed on a $j^{th}$ fuse element of an $i^{th}$ storage cell of the fuse storage array. The programming operation may include applying a first programming voltage Vppyj to the second terminal Bj of the $j^{th}$ fuse element Fj; and applying a second programming voltage on the ith word line WLi. According to the operation method, the first programming voltage Vppyj may be larger than the read voltage Vppxj; and the second programming voltage may be larger than the turn-on voltage.

When performing a programming operation, the first programming voltage Vppyj may be large, and the second programming voltage may also be large. Therefore, the $j^{th}$ fuse element Fj may be applied with a large fusing current to blow the $j^{th}$ fuse element Fj, thereby realizing the programming operation of the fuse storage cell.

In one embodiment, the time of the programming operation may be less than 10 μs. With the time of the programming operation less than 10 μs, when a large first programming voltage Vppyj is applied to the second terminal Bj of the $j^{th}$ fuse element Fj and a large second programming voltage is applied to the $i^{th}$ word line WLi, the circuit may be able to generate a large instantaneous current. When the instantaneous current flows through the $j^{th}$ fuse element Fj, the fuse element Fj may be blown to complete the programming operation of the fuse storage cell.

Each storage cell of the fuse storage array may include a first fuse element F1, a second fuse element F2, . . . , a $j^{th}$ fuse element Fj, . . . , and an $N^{th}$ fuse element FN. Moreover, in the M storage cells of the fuse storage array, the first programming voltage Vppyj may be simultaneously applied to the second terminals of a number M of $j^{th}$ fuse elements Fj. As such, when applying the first programming voltage Vppyj to a second terminal Bj of the $j^{th}$ fuse element Fj of any storage cell, because the total number of storage cells is reduced, the current path to the $j^{th}$ fuse element Fj may become shorter, so that the loss of the first programming voltage Vppyj may be reduced. Therefore, the power consumption of the circuit of the fuse storage array may be reduced, and the performance of the circuit may be improved.

According to the disclosed storage array, the operation method of the fuse storage array is simple, and the operation efficiency is high. As such, multiple accesses of the fuse storage array may be realized, and the utilization rate of the fuse storage array may be improved.

Compared to existing fuse storage cell, storage array, and operation method, the disclosed fuse storage cell, storage array, and operation method demonstrate the following exemplary advantages.

According to the disclosed fuse storage cell, the fuse storage cell includes a transistor and a total of N fuse elements, such that a single transistor can be used to drive each fuse element in stages, thereby improving the utilization rate of the fuse storage cell.

According to the disclosed fuse storage array, a fuse storage cell includes a transistor and multiple fuse elements such that the total number of fuse storage cells is reduced. As such, the storage circuit is simple, and the size of the circuit layout is reduced. Therefore, the area of the fuse storage array on the chip may be saved, which further improves the utilization of the chip area.

Further, each storage cell of the fuse storage array includes a total of N fuse elements, and a second terminal of a $j^{th}$ fuse element of the plurality of storage cells is configured for simultaneously applying a read voltage or a programming voltage, where j is a positive integer smaller than or equal to N. As such, when applying a read voltage or programming voltage to the second terminal of the $j^{th}$ fuse element of any storage cell, because the total number of storage cells is reduced, the current path to the $j^{th}$ fuse element becomes shorter, so that the loss of the read voltage or programming voltage may be reduced. Therefore, the power consumption of the circuit of the fuse storage array may be reduced, and the performance of the circuit may be improved.

According to the disclosed fuse storage array and operation method, the operation method of the fuse storage array is simple, and the operation efficiency is high. As such, multiple accesses of the fuse storage array may be realized, and the utilization rate of the fuse storage array may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A fuse storage cell, comprising:
   a transistor, including a source, a drain, and a gate;
   at least two fuse elements, wherein:
   each fuse element of the at least two fuse elements includes a first terminal and a second terminal, wherein the first terminal of the each fuse element of the at least two fuse elements is electrically connected to the drain of the transistor and the second terminal of the each fuse element of the at least two fuse elements is respectively configured for inputting a read voltage or a programming voltage; and N is a positive integer number of the at least two fuse elements.

2. The fuse storage cell according to claim 1, further including:
a word line electrically connected to the gate of the transistor.

3. The fuse storage cell according to claim 1, wherein:
the source of the transistor is connected to a ground.

4. The fuse storage cell according to claim 1, wherein:
second terminals of the at least two fuse elements configured for inputting read voltages or programming voltages are independent from each other, and
the first terminal of the each fuse element of the at least two fuse elements is electrically connected to each other.

5. The fuse storage cell according to claim 1, wherein:
the each fuse element of the at least two fuse elements includes at least one of a metal fuse element or a polycrystalline-silicon fuse element.

6. A fuse storage array, comprising:
M storage cells, wherein M is a positive integer, and each storage cell of the M storage cells includes:
a transistor, including a source, a drain, and a gate, and at least two fuse elements, wherein:
each fuse element of the at least two fuse elements includes a first terminal and a second terminal, wherein the first terminal of the each fuse element of the at least two fuse elements is electrically connected to the drain of the transistor and the second terminal of the each fuse element of the at least two fuse elements is configured for inputting a read voltage or a programming voltage; and
N is a positive integer number of the at least two fuse elements.

7. The fuse storage array according to claim 6, further including:
a plurality of word lines, wherein:
each word line of the plurality of word lines is electrically connected to the gate of the transistor in the fuse storage array.

8. The fuse storage array according to claim 6, wherein:
the source of each transistor in the fuse storage array is connected to a ground.

9. The fuse storage array according to claim 6, wherein:
the at least two fuse elements included in the each storage cell of the M storage cells includes a first fuse element, a second fuse element, . . . , and an $N^{th}$ fuse element; and
in the M storage cells of the fuse storage array, second terminals of a number M of $j^{th}$ fuse elements are configured for simultaneously applying read voltages or programming voltages, where j is a positive integer smaller than or equal to N.

10. The fuse storage array according to claim 6, wherein:
in the each storage cell of the M storage cells, second terminals of the at least two fuse elements configured for inputting read voltages or programming voltages are independent from each other.

11. The fuse storage array according to claim 6, wherein:
in the each storage cell of the M storage cells, the each fuse element of the at least two fuse elements includes at least one of a metal fuse element or a polycrystalline-silicon fuse element.

12. An operation method of a fuse storage array, comprising:
providing the fuse storage array, including M storage cells, wherein:
M is a positive integer, and each storage cell of the M storage cells includes a transistor, including a source, a drain, and a gate, and at least two fuse elements, wherein:
each fuse element of the at least two fuse elements includes a first terminal and a second terminal, wherein the first terminal of the each fuse element of the at least two fuse elements is electrically connected to the drain of the transistor and the second terminal of the each fuse element of the at least two fuse elements is configured for inputting a read voltage or a programming voltage, and
N is a positive integer number of the at least two fuse elements;
performing a read operation on a $j^{th}$ fuse element of an $i^{th}$ storage cell of the fuse storage array, wherein:
i is a positive integer smaller than or equal to M, j is a positive integer smaller than or equal to N, and the read operation includes:
applying a read voltage on the second terminal of the $j^{th}$ fuse element of the $i^{th}$ storage cell, applying a turn-on voltage on a word line electrically connected to the gate of the transistor of the $i^{th}$ storage cell, and reading a current signal on the source of the transistor of the $i^{th}$ storage cell; and
performing a programming operation on the $j^{th}$ fuse element of the $i^{th}$ storage cell of the fuse storage array, wherein the programming operation includes:
applying a first programming voltage on the second terminal of the $i^{th}$ fuse element of the $i^{th}$ storage cell, and applying a second programming voltage on the word line electrically connected to the gate of the transistor of the $i^{th}$ storage cell.

13. The operation method according to claim 12, wherein:
the first programming voltage is higher than the read voltage; and
the second programming voltage is higher than the turn-on voltage.

14. The operation method according to claim 12, wherein:
a read state of the each storage cell of the M storage cells includes "0" or "1".

15. The operation method according to claim 14, wherein:
when the read state is "0", the read current signal is greater than 600 μA; and
when the read state is "1", the read current signal is less than 15 μA.

16. The operation method according to claim 12, wherein:
an operation time of the programming operation is less than 10 μs.

17. The operation method according to claim 12, wherein:
the source of each transistor in the fuse storage array is connected to a ground.

18. The operation method according to claim 12, wherein:
the at least two fuse elements included in the each storage cell of the M storage cells includes a first fuse element, a second fuse element, . . . , and an $N^{th}$ fuse element; and in the M storage cells of the fuse storage array, second terminals of a number M of $j^{th}$ fuse elements are configured for simultaneously applying read voltages or programming voltages, where j is a positive integer smaller than or equal to N.

19. The operation method according to claim 12, wherein:
in the each storage cell of the M storage cells, second terminals of the at least two fuse elements configured for inputting read voltages or programming voltages are independent from each other.

20. The operation method according to claim 12, wherein:
in the each storage cell of the M storage cells, the each fuse element of the at least two fuse elements includes at least one of a metal fuse element or a polycrystalline-silicon fuse element.

\* \* \* \* \*